United States Patent
Wang et al.

(10) Patent No.: US 11,437,384 B1
(45) Date of Patent: Sep. 6, 2022

(54) SEMICONDUCTOR MEMORY DEVICE AND METHOD FOR MANUFACTURING THE SAME

(71) Applicant: NANYA TECHNOLOGY CORPORATION, New Taipei (TW)

(72) Inventors: Jr-Chiuan Wang, New Taipei (TW); Rou-Wei Wang, Taipei (TW); Wei-Yu Chen, Miaoli County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/228,231

(22) Filed: Apr. 12, 2021

(51) Int. Cl.
*H01L 27/108* (2006.01)

(52) U.S. Cl.
CPC .. *H01L 27/10885* (2013.01); *H01L 27/10808* (2013.01); *H01L 27/10823* (2013.01); *H01L 27/10855* (2013.01); *H01L 27/10876* (2013.01); *H01L 27/10888* (2013.01); *H01L 27/10897* (2013.01)

(58) Field of Classification Search
None
See application file for complete search history.

(56) References Cited

U.S. PATENT DOCUMENTS

| 6,262,448 B1* | 7/2001 | Enders | H01L 27/10864 257/302 |
| 2003/0205748 A1* | 11/2003 | Park | H01L 27/10864 257/E21.396 |
| 2022/0102353 A1* | 3/2022 | Kim | H01L 27/10885 |

* cited by examiner

*Primary Examiner* — Steven M Christopher
(74) *Attorney, Agent, or Firm* — Muncy, Geissler, Olds & Lowe, P.C.

(57) ABSTRACT

The present disclosure provides a semiconductor memory device and a method for manufacturing the semiconductor memory device. The method includes steps of: providing a substrate including a storage area and a peripheral area, wherein the storage area has a contact plug, a bit line structure adjacent to the contact plug, an air gap between the bit line structure and the contact plug, a barrier layer conformally overlaying the bit line structure, and a landing pad above the barrier layer; forming a trench between the storage area and the peripheral area; filling the trench with a nitride material; forming a first oxide layer above the nitride material in the trench and on the landing pad; forming a nitride layer above the first oxide layer; and forming a second oxide layer above the nitride layer.

8 Claims, 8 Drawing Sheets ized circuitry (IC).
SEMICONDUCTOR MEMORY DEVICE AND METHOD FOR MANUFACTURING THE SAME

TECHNICAL FIELD

The present disclosure relates to a semiconductor memory device and a method for manufacturing the same, and more particularly, to a semiconductor memory device having a first oxide layer which protects the top of an air gap from being etched through by an etchant.

DISCUSSION OF THE BACKGROUND

Semiconductor devices are essential for many modern applications. With the advancement of electronic technology, semiconductor devices are becoming smaller in size while providing greater functionality and comprising greater amounts of integrated circuitry (IC).

A memory is a device or component used to store a large amount of information in a digital system, and is an important part of computers and digital devices. Memory can be divided into two categories: random access memory (RAM) and read-only memory (ROM).

In dynamic random-access memory (DRAM), there is a serious problem associated with leakage current. Bonding between silicon oxide in an interlayer insulating layer of a device and silicon near an interface between a semiconductor substrate of the device and the interlayer insulating layer, or between a gate dielectric layer and silicon near an interface between a semiconductor substrate of the device and the gate dielectric layer results in the existence of an interface energy level, which causes a leakage current to flow from the diffusion layer to the semiconductor substrate. Such leakage current deteriorates the device characteristics of the DRAM.

As DRAM devices become more highly integrated, design rules of the DRAM devices become finer. To reduce parasitic capacitance between a bit line structure and a landing pad, formation of an air gap there between has been proposed. In order to form the air gap, after removing a sacrificial layer, a suitable sealing process must be performed to effectively seal the air gap. Normally, a pad isolation insulator is formed for filling a trench between a landing pad and a bit line structure. Illustrative cross sections and a top view of a semiconductor memory device 10 including a pad isolation insulator manufactured by a conventional method are shown in FIGS. 1A, 1B and 1C (prior art). The formation of a pad isolation insulator is typically formed by directly applying a nitride layer 103 above a landing pad 101 and then applying an oxide layer 105 above the nitride layer 103. However, such a process would result in undesired defects. Because the contact plug 107 contacts the nitride layer 103 directly, the top of an air gap 109 would be etched through by an etchant in a subsequent etching step. Therefore, the air gap 109 would also be filled with a deposition material during a subsequent depositing step. The defect of the air gaps would result in a loss of dielectric property. Eventually, wafer acceptance test (WAT) failure occurs.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for manufacturing a semiconductor memory device, comprising: providing a substrate including a storage area and a peripheral area, wherein the storage area has a contact plug, a bit line structure adjacent to the contact plug, an air gap between the bit line structure and the contact plug, a barrier layer conformally overlaying the bit line structure, and a landing pad above the barrier layer; forming a trench between the storage area and the peripheral area; filling the trench with a nitride material; forming a first oxide layer above the nitride material in the trench and on the landing pad; forming a nitride layer above the first oxide layer; and forming a second oxide layer above the nitride layer.

In some embodiments, the step of providing a substrate including a storage area and a peripheral area comprises providing a substrate selected from the group consisting of a silicon substrate, a gallium arsenide substrate, a silicon germanium substrate, a ceramic substrate, a quartz substrate, a glass substrate for a display, and a silicon-on-insulator (SOI) substrate.

In some embodiments, the step of forming a trench between the storage area and the peripheral area comprises etching the landing pad to form a recess.

In some embodiments, the step of forming a trench between the storage area and the peripheral area is carried out by using a dry etching process.

In some embodiments, the step of filling the trench with a nitride material comprises filling the trench with silicon nitride.

In some embodiments, the first oxide layer is a silicon oxide layer.

In some embodiments, the nitride layer is a silicon nitride layer.

In some embodiments, the second oxide layer is a silicon oxide layer.

Another aspect of the present disclosure provides a semiconductor memory device. The semiconductor memory device comprises a substrate, which includes a storage area and a peripheral area, wherein the storage area has a contact plug, a bit line structure adjacent to the contact plug, an air gap between the bit line structure and the contact plug, a barrier layer conformally overlaying the bit line structure, and a landing pad above the barrier layer, wherein the substrate includes a trench between the storage area and the peripheral area, the trench is filled with a nitride material, and the substrate further comprises a first oxide layer above the nitride material in the trench and on the landing pad, a nitride layer above the first oxide layer, and a second layer above the nitride layer.

In some embodiments, the substrate is selected from the group consisting of a silicon substrate, a gallium arsenide substrate, a silicon germanium substrate, a ceramic substrate, a quartz substrate, a glass substrate for a display, and a silicon-on-insulator (SOI) substrate.

In some embodiments, the bit line structure includes a bit line contact plug, a conductive pattern above the bit line contact plug, and a bit line isolating layer above the conductive pattern.

In some embodiments, the substrate further comprises a pair of bit line spacers along the sidewalls of the bit line structure.

In some embodiments, the substrate further comprises a pair of contact plug spacers along the sidewalls of the contact plug.

In some embodiments, the nitride material for filling the trench is silicon nitride.

In some embodiments, the first oxide layer is a silicon oxide layer.

In some embodiments, the nitride layer is a silicon nitride layer.

In some embodiments, the second oxide layer is a silicon oxide layer.

With the above-mentioned method for manufacturing a semiconductor memory device and the configuration of the semiconductor memory device, wafer acceptance test (WAT) failure can be reduced or avoided. The semiconductor memory device disclosed in the present disclosure has a first oxide layer above the nitride material in the trench and on the landing pad, a nitride layer above the first oxide layer, and a second layer above the nitride layer. Due to the existence of the first oxide layer, the defect that corrosive substances such as water and oxygen would enter the trench can be avoided. In addition, because the first oxide layer can act as an etch stop layer or a barrier layer, it protects the top of the air gap from being etched through by an etchant, so that the dielectric property provided by the air gap is maintained. As a result, production efficiency can be improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
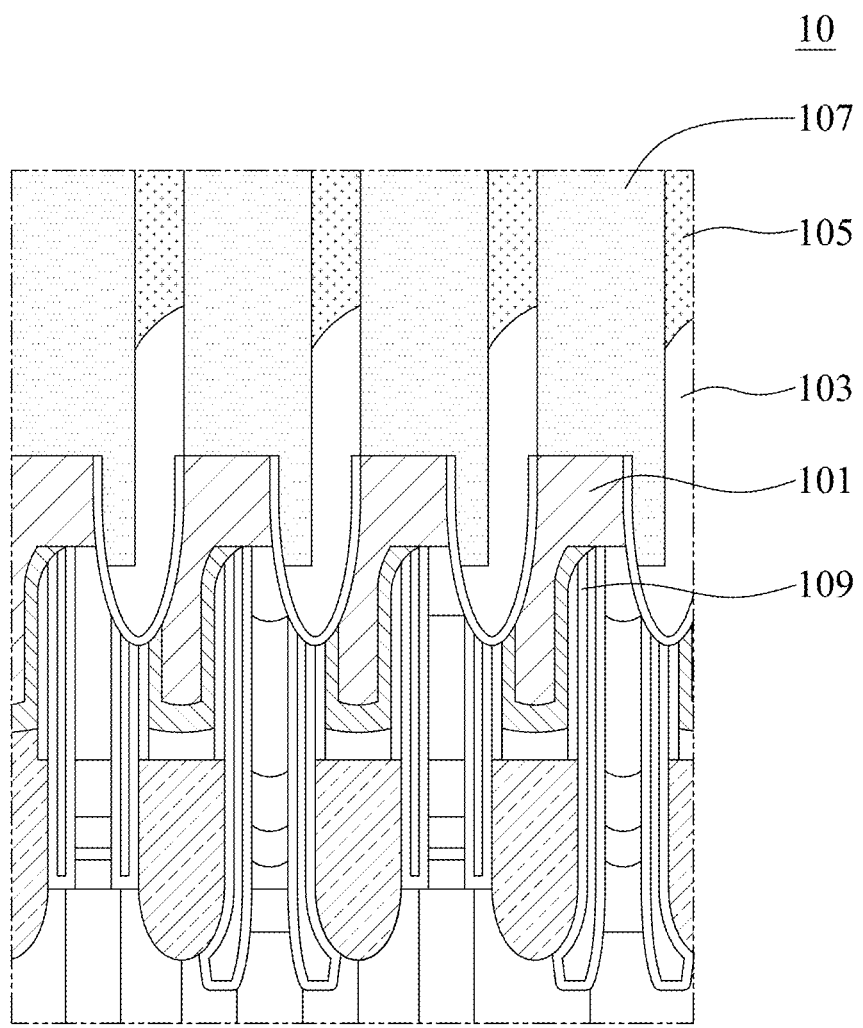
FIGS. 1A, 1B and 1C are schematic diagrams of cross sections and top view of a semiconductor memory device of the prior art.

Embodiments (or examples) of the disclosure illustrated in the drawings are now described using specific language. It shall be understood that no limitation to the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

The term "substantially" may be used herein to reflect the meaning of the words "generally" or "equally". For example, items described as "substantially the same," "substantially equal," or "substantially planar," may be exactly the same, equal, or planar, or may be the same, equal, or planar within acceptable variations that may occur, for example, due to manufacturing processes.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The present disclosure will be described in detail with reference to the accompanying drawings with numbered elements. It should be noted that the drawings are in greatly simplified form and are not drawn to scale. Moreover, dimensions have been exaggerated in order to provide a clear illustration and understanding of the present invention.

Figure 1B:
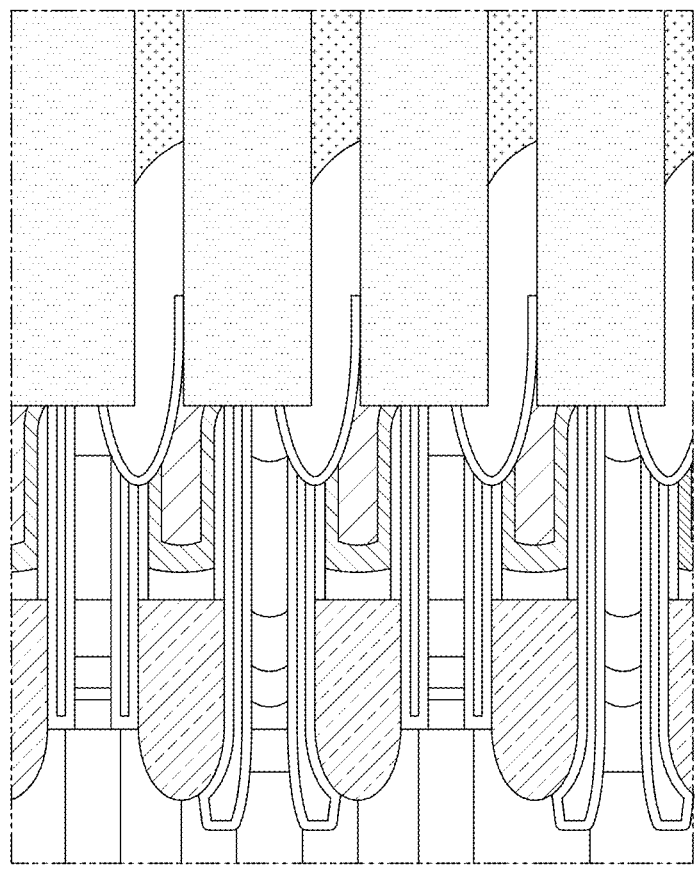
Figure 1C:
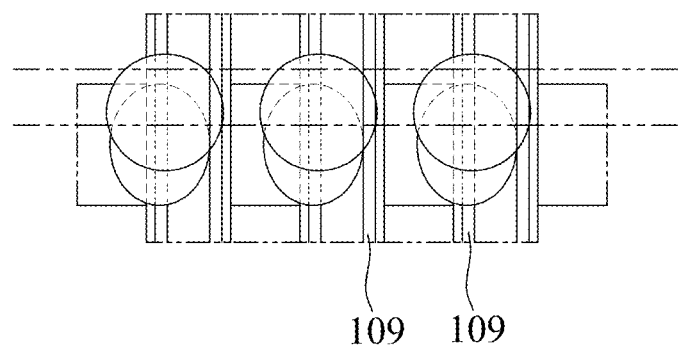
Figure 2:
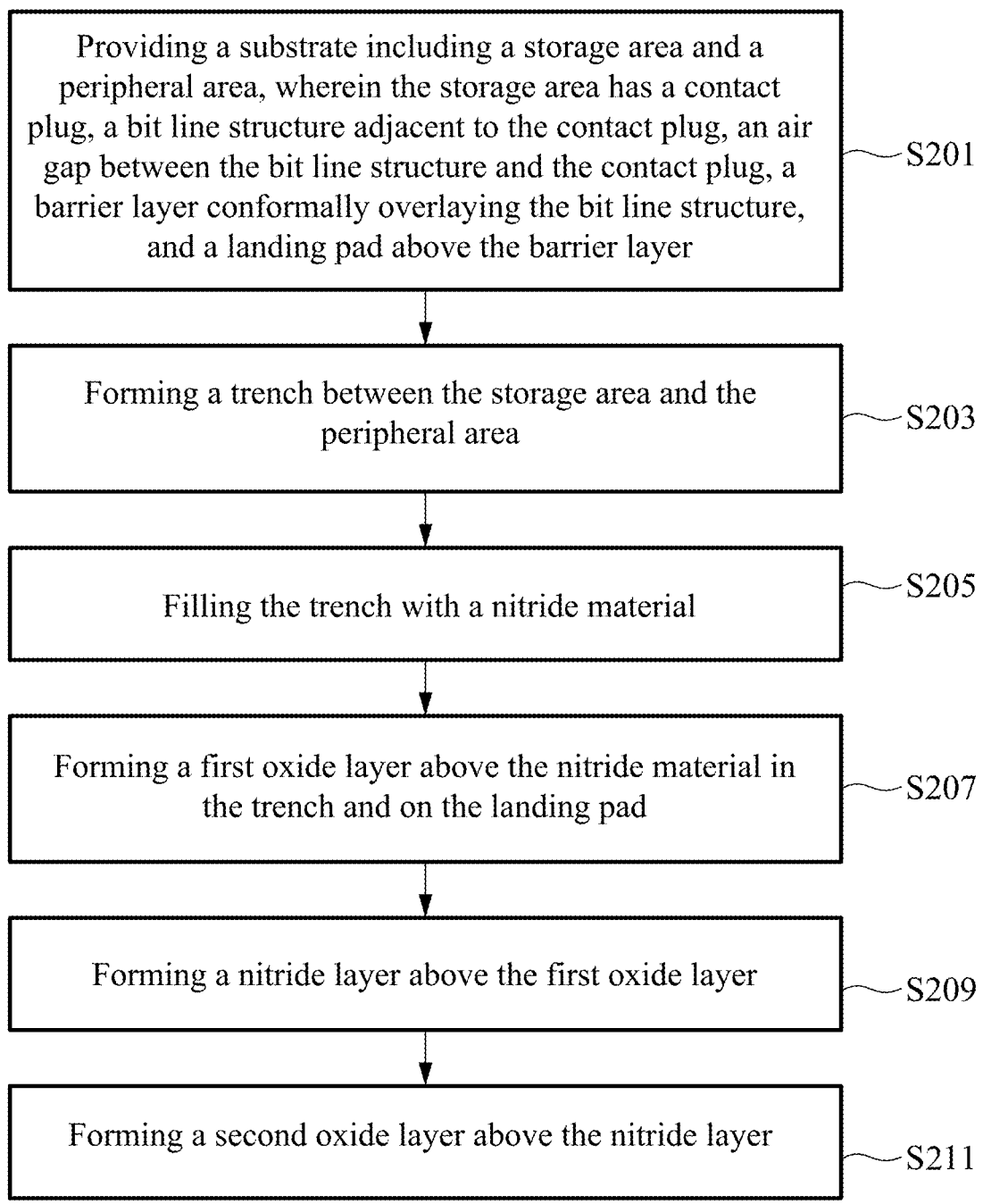
FIG. 2 is a representative flow diagram illustrating a method 10 for manufacturing a semiconductor memory device 20 according to an embodiment of the present disclosure.
Figure 3A:
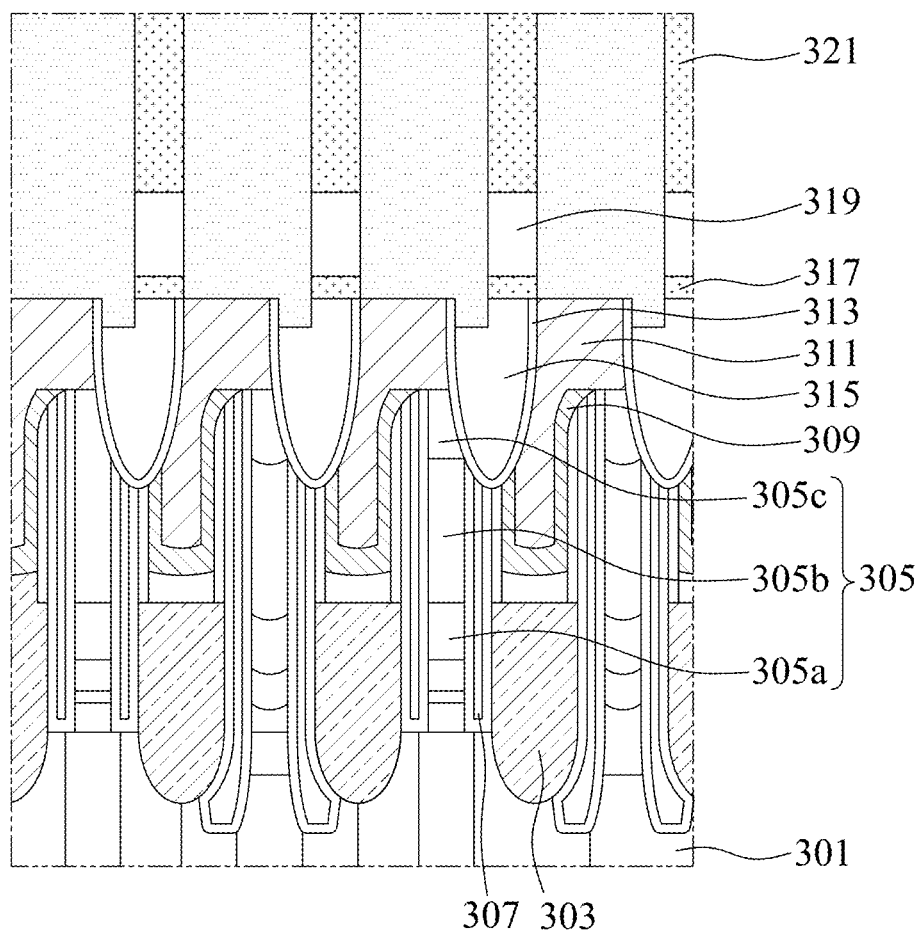
FIGS. 3A, 3B and 3C are schematic diagrams of cross sections and top view of a semiconductor memory device according to an embodiment of the present disclosure.
Figure 3B:
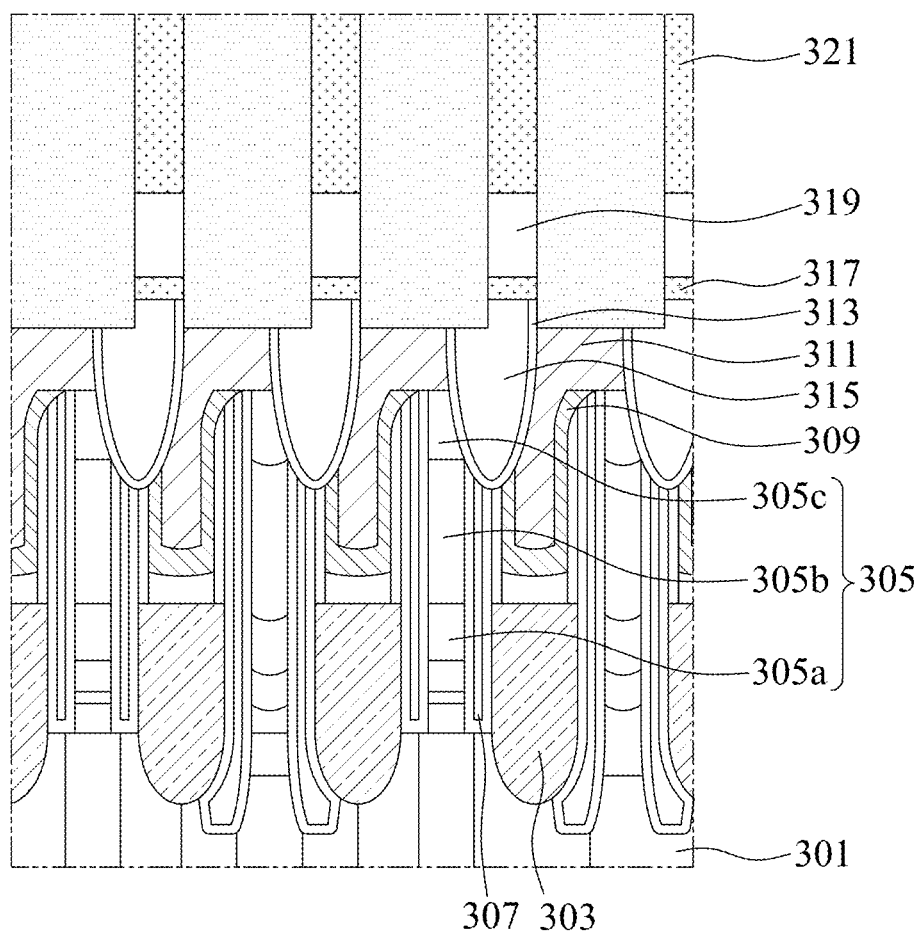
Figure 3C:
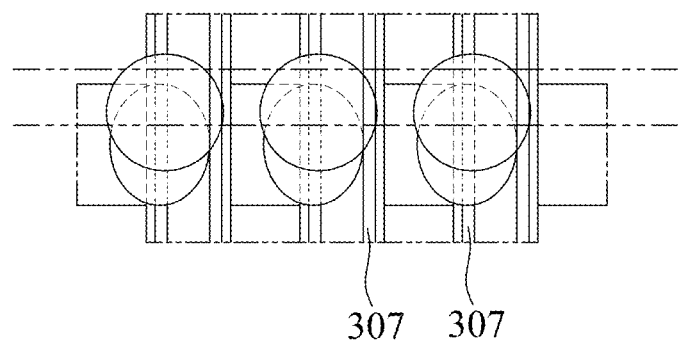
Figure 4:
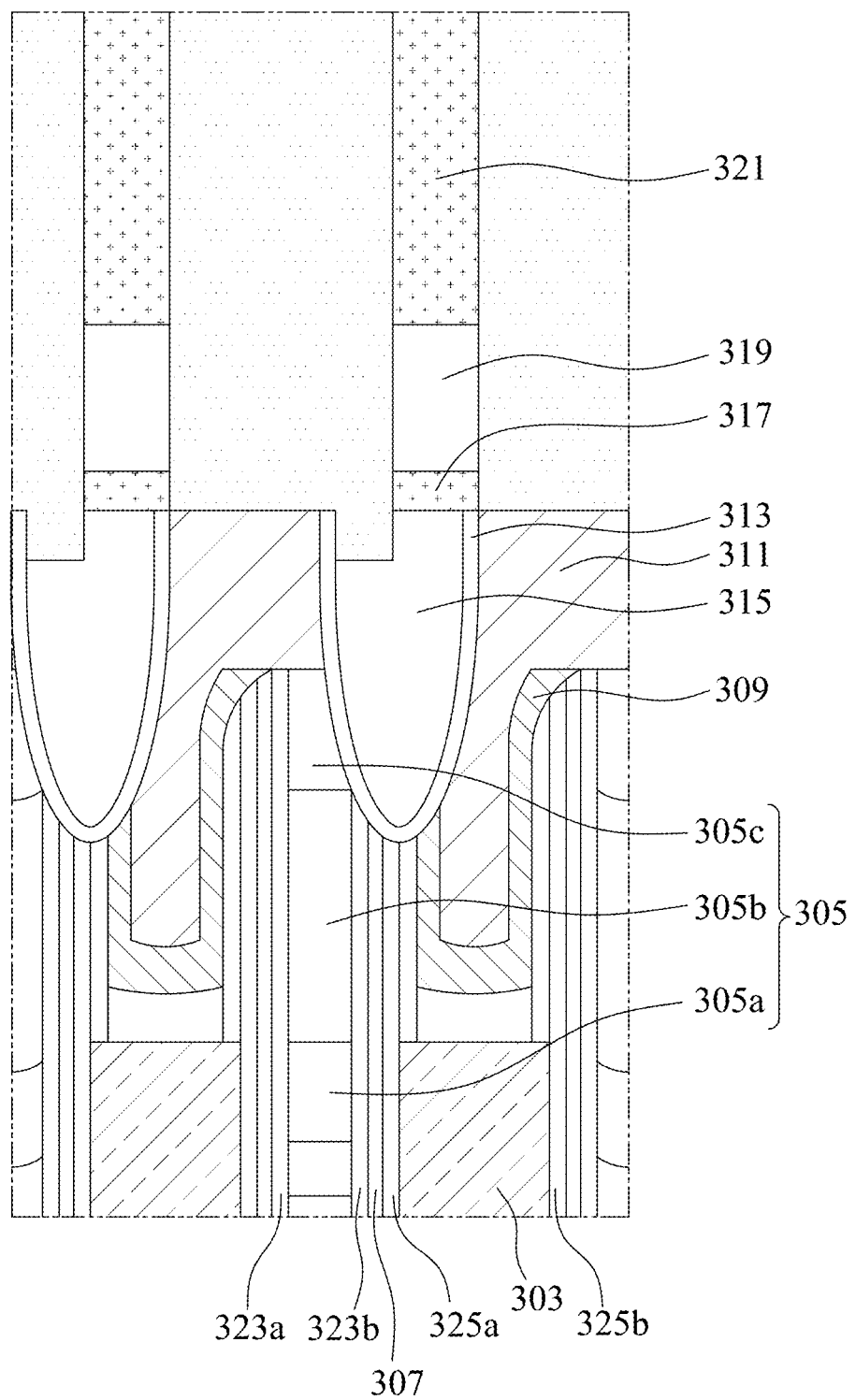
FIG. 4 is a partial enlarged view of FIG. 3B.

FIGS. 1A, 1B and 1C are schematic diagrams of cross sections and top view of a semiconductor memory device of the prior art. FIG. 2 is a representative flow diagram illustrating a method 10 for manufacturing a semiconductor memory device 20 according to an embodiment of the present disclosure. FIGS. 3A, 3B and 3C are schematic diagrams of cross sections and top view of a semiconductor memory device according to an embodiment of the present disclosure. FIG. 4 is a partial enlarged view of FIG. 3B.

Referring to FIG. 2, in step S201, a substrate 301 including a storage area and a peripheral area is provided, wherein the storage area has a contact plug 303, a bit line structure 305 adjacent to the contact plug 303, an air gap 307 between the bit line structure 305 and the contact plug 303, a barrier layer 309 conformally overlaying the bit line structure 305, and a landing pad 311 above the barrier layer 309. In the present disclosure, the term "substrate" means and includes a base material or construction upon which materials are formed. It will be appreciated that the substrate may include a single material, a plurality of layers of different materials, a layer or layers having regions of different materials or different structures in them, or another similar arrangement. These materials may include semiconductors, insulators, conductors, or combinations thereof. For example, the substrate 301 may be a semiconductor substrate, a base semiconductor layer on a supporting structure, a metal electrode, or a semiconductor substrate having one or more layers, structures or regions formed thereon. The substrate 301 may be a semiconductor wafer such as a silicon wafer. Alternatively or additionally, the substrate 301 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium and/or diamond. Examples of the compound semiconductor materials may include, but are not limited to, silicon carbide, gallium arsenic, gallium phosphide, indium phosphide, indium arsenide and/or indium antimonide. Examples of the alloy semiconductor materials may include, but are not limited to, SiGe, GaAsP, AlInAs, AlGaAs, GaInAs, GaInP and/or GaInAsP. In some embodiments, the substrate 301 may be a silicon substrate, a gallium arsenide substrate, a silicon germanium substrate, a ceramic substrate, a quartz substrate, a glass substrate for a display, a silicon-on-insulator (SOI) substrate, or the like.

In step S203, an etch process, such as an anisotropic dry etch process or a post reactive ion etching (RIE) process, may be performed to form a trench 313 in the substrate 301. The etching process may be continuously performed until a desired depth of the trench 313 is achieved. After the etch process, a bottom layer (not shown) may be correspondingly formed and attached to sidewalls and a bottom of the trench 313. The bottom layer may be formed of, for example, silicon oxide, silicon oxynitride, silicon nitride oxide, silicon nitride, or the like. It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen and nitrogen and in which a proportion of nitrogen is greater than that of oxygen. Optionally, a cleaning process using a reducing agent may be optionally performed to remove the defects on a top surface of the substrate 301. The reducing agent may be titanium tetrachloride, tantalum tetrachloride, or a combination thereof.

In step S205, a step of filling the trench 313 with a nitride material 315 comprises applying a nitride material such as nitride oxide or silicon nitride to the trench 313. Preferably, the step of filling the trench 313 with a nitride material comprises filling the trench 313 with silicon nitride. Optionally, a planarization process, such as chemical mechanical polishing, may be performed after the step of filling the trench 313 with a nitride material 315 to remove excess nitride material 315 and provide a substantially planar surface of the trench 313 for subsequent processing steps. In fabrication of microelectronics devices, an important step is polishing, especially chemical-mechanical polishing (CMP) of surfaces for removing a selected material and/or planarizing a structure. In more advanced node CMP processes, for example, a low-k or an ultra-low-k layer is deposited over a silicon oxide layer or a silicon nitride layer to serve as a capping layer. Therefore, removal of the low-k film capping layer while keeping the underlying silicon oxide layer or silicon nitride layer is an important step in the CMP process. According to a preferred embodiment of the present disclosure, a CMP process uses a CMP polishing composition that can quickly remove the low-k or ultra-low-k film capping layer and has a high selectivity of polishing low-k films over a silicone oxide or silicon nitride film.

In step S207, a process such as atomic layer deposition (ALD), atomic layer epitaxy (ALE), atomic layer chemical vapor deposition (ALCVD), spin-coating, sputtering, or the like can be used to apply a first oxide layer 317 above the nitride material 315 in the trench 313 and on the landing pad 311. Any oxides commonly used in the manufacture of semiconductors can be used in step S207 of the present disclosure. According to a preferred embodiment of the present disclosure, the step of forming the first oxide layer 317 above the nitride material 315 in the trench 313 and on the landing pad 311 comprises forming a silicon oxide layer by using ALD. Optionally, a planarization process, such as chemical mechanical polishing, may be performed after step S207.

In step S209, a process such as atomic layer deposition (ALD), atomic layer epitaxy (ALE), atomic layer chemical vapor deposition (ALCVD), spin-coating, sputtering, or the like can be used to apply a nitride layer 319 above the first oxide layer 317. According to a preferred embodiment of the present disclosure, the step of forming the nitride layer 319 above the first oxide layer 317 is carried out using ALD. Any nitrides commonly used in the manufacture of semiconductors can be used in step S209 of the present disclosure. According to a preferred embodiment of the present disclosure, the step of forming the nitride layer 319 above the first oxide layer 317 comprises forming a silicon nitride layer above the first oxide layer 317. Optionally, a planarization process, such as chemical mechanical polishing, may be performed after step S209.

In step S211, a process such as atomic layer deposition (ALD), atomic layer epitaxy (ALE), atomic layer chemical vapor deposition (ALCVD), spin-coating, sputtering, or the like can be used to apply a second oxide layer 321 over the nitride layer 319. Any oxides commonly used in the manufacture of semiconductors can be used in step S211 of the present disclosure. For example, oxides such as silicon oxide, titanium oxide, aluminum oxide, hafnium oxide, yttrium oxide, zirconium oxide, or the like can be used to perform step S211. According to a preferred embodiment of the present disclosure, the step of forming the second oxide layer 321 over the nitride layer 319 comprises applying a silicon oxide layer over the nitride layer 319. Optionally, a planarization process, such as chemical mechanical polishing, may be performed after step S211.

FIGS. 3A and 3B illustrative cross sections of a semiconductor memory device 30 according to an embodiment of the present disclosure. FIG. 3C is a top view of FIGS. 3A and 3B. Referring to FIGS. 3A and 3B, the cross sections of a semiconductor memory device 20 which has a first oxide layer 317 above the nitride material 315 in the trench 313 and on the landing pad 311, a nitride layer 319 above the first oxide layer 317, and an oxide layer 321 above the nitride layer 319 have been provided.

Referring to FIG. 4, which is a partial enlarged view of FIG. 3B, the semiconductor memory device comprises a substrate 301, which includes a storage area and a peripheral area, wherein the storage area has a contact plug 303, a bit line structure 305 adjacent to the contact plug 303, an air gap 307 between the bit line structure 305 and the contact plug 303, a barrier layer 309 conformally overlaying the bit line structure 305, and a landing pad 311 above the barrier layer 309. The substrate 301 includes a trench 313 between the storage area and the peripheral area, wherein the trench 313 is filled with a nitride material 315. The substrate 301 further comprises a first oxide layer 317 above the nitride material 315 in the trench 313 and on the landing pad 311, a nitride layer 319 above the first oxide layer 317, and an oxide layer 321 above the nitride layer 319. In addition, the substrate 301 further comprises a pair of bit line spacers 323a and 323b along sidewalls of the bit line structure 305, and a pair of contact plug spacers 325a and 325b along sidewalls of the contact plug 303.

The semiconductor memory device disclosed in the present disclosure has a first oxide layer above the nitride material in the trench and on the landing pad, a nitride layer above the first oxide layer, and a second layer above the nitride layer. Due to the existence of the first oxide layer, the defect that corrosive substances such as water and oxygen would enter the trench can be avoided. In addition, because the first oxide layer can act as an etch stop layer or a barrier layer, it protects the top of the air gap from being etched through by an etchant, so that the dielectric property provided by the air gap is maintained. As a result, wafer acceptance test (WAT) failure can be reduced or avoided and production efficiency can be improved.

It should be understood that the preceding examples are included to demonstrate specific embodiments of the present disclosure. It should be appreciated by those having skill in the art that the techniques disclosed in the claims which follow represent techniques discovered by the inventors to function properly in applications of the present disclosure, and thus can be considered to constitute preferred modes for its application. However, it should be understood that the present disclosure is not intended to be limited to the particular forms disclosed. Rather, different aspects of the disclosed process may be utilized in various combinations and/or independently. Thus, the present disclosure is not limited to only those combinations shown herein, but rather may include other combinations. Further, those having skill in the art should, in light of the present disclosure, appreciate that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for manufacturing a semiconductor memory device, comprising:
    providing a substrate including a storage area and a peripheral area, wherein the storage area has a contact plug, a bit line structure adjacent to the contact plug, an air gap between the bit line structure and the contact plug, a barrier layer conformally overlaying the bit line structure, and a landing pad above the barrier layer;
    forming a trench between the storage area and the peripheral area;
    filling the trench with a nitride material;
    forming a first oxide layer above the nitride material in the trench and on the landing pad;
    forming a nitride layer above the first oxide layer; and
    forming a second oxide layer above the nitride layer.

2. The method according to claim 1, wherein the step of providing a substrate including a storage area and a peripheral area comprises providing a substrate selected from the group consisting of a silicon substrate, a gallium arsenide substrate, a silicon germanium substrate, a ceramic substrate, a quartz substrate, a glass substrate for a display, and a silicon-on-insulator (SOI) substrate.

3. The method according to claim 1, wherein the step of forming a trench between the storage area and the peripheral area comprises etching the landing pad to form a recess.

4. The method according to claim 1, wherein the step of forming a trench between the storage area and the peripheral area is carried out by using a dry etching process.

5. The method according to claim 1, wherein the step of filling the trench with a nitride material comprises filling the trench with silicon nitride.

6. The method according to claim 1, wherein the first oxide layer is a silicon oxide layer.

7. The method according to claim 1, wherein the nitride layer is a silicon nitride layer.

8. The method according to claim 1, wherein the second oxide layer is a silicon oxide layer.

* * * * *